(12) United States Patent
Mizukami et al.

(10) Patent No.: US 8,733,906 B2
(45) Date of Patent: May 27, 2014

(54) ELECTROMECHANICAL CONVERSION ELEMENT, LIQUID DROP EJECTION HEAD, LIQUID DROP EJECTION DEVICE, AND IMAGE FORMING APPARATUS

(75) Inventors: Satoshi Mizukami, Kanagawa (JP); Masaru Shinkai, Kanagawa (JP); Masahiro Ishimori, Tokyo (JP); Yoshikazu Akiyama, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/615,399

(22) Filed: Sep. 13, 2012

(65) Prior Publication Data

US 2013/0070029 A1    Mar. 21, 2013

(30) Foreign Application Priority Data

Sep. 16, 2011    (JP) ................................. 2011-203533

(51) Int. Cl.
*B41J 2/015*    (2006.01)

(52) U.S. Cl.
USPC ............................................................ 347/68

(58) Field of Classification Search
None
See application file for complete search history.

(56) References Cited

U.S. PATENT DOCUMENTS

| 6,096,434 | A | 8/2000 | Yano et al. | |
|---|---|---|---|---|
| 6,194,228 | B1 | 2/2001 | Fujiki et al. | |
| 6,351,006 | B1 | 2/2002 | Yamakawa et al. | |
| 8,102,100 | B2 * | 1/2012 | Hamada et al. | 310/358 |
| 2003/0102500 | A1 | 6/2003 | Cross | |
| 2004/0130026 | A1 * | 7/2004 | Imai et al. | 257/751 |
| 2005/0001251 | A1 | 1/2005 | Itokawa et al. | |
| 2005/0224851 | A1 | 10/2005 | Nakazawa | |
| 2006/0108624 | A1 | 5/2006 | Itokawa et al. | |
| 2011/0090289 | A1 | 4/2011 | Mizukami | |

FOREIGN PATENT DOCUMENTS

| JP | 11-195768 | 7/1999 |
|---|---|---|
| JP | 3249496 | 1/2002 |
| JP | 2002-94018 | 3/2002 |
| JP | 2003-218325 | 7/2003 |
| JP | 2003-282987 | 10/2003 |
| JP | 3472087 | 12/2003 |
| JP | 2004-186646 | 7/2004 |
| JP | 2004-262253 | 9/2004 |
| JP | 3782401 | 6/2006 |
| JP | 3806127 | 8/2006 |
| JP | 4011334 | 11/2007 |
| JP | 4099818 | 6/2008 |
| JP | 4220459 | 2/2009 |
| JP | 2009-224368 | 10/2009 |

OTHER PUBLICATIONS

J. S. Cross et al, "(Pb, La)(Zr, Ti)O3 Film Grain-Boundary Conduction with SrRuO3 Top Electrodes" Jpn. J. Appl. Phys. vol. 40 (2001), Part 2, No. 4A, pp. L346-L348, Apr. 1, 2001.

* cited by examiner

*Primary Examiner* — Matthew Luu
*Assistant Examiner* — Erica Lin
(74) *Attorney, Agent, or Firm* — Cooper & Dunham LLP

(57) ABSTRACT

Disclosed is an electromechanical conversion element, including an electromechanical conversion film including a PZT, an upper electrode formed on a top of the electromechanical conversion film and including a first strontium ruthenium oxide, and a lower electrode formed on a bottom of the electromechanical conversion film and including a second strontium ruthenium oxide, wherein Sr-pzt/Sr-sr≤0.01, wherein Sr-pzt is a SIMS intensity for a secondary ion of strontium of the PZT at a position of ½ of a thickness of the electromechanical conversion film and Sr-sr is a SIMS intensity for a secondary ion of strontium of the second strontium ruthenium oxide at a position of ½ of a thickness of the lower electrode.

12 Claims, 10 Drawing Sheets

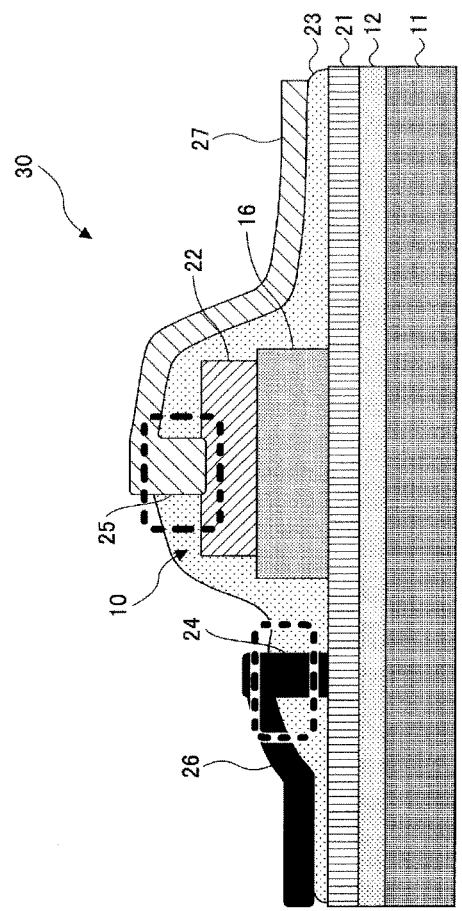

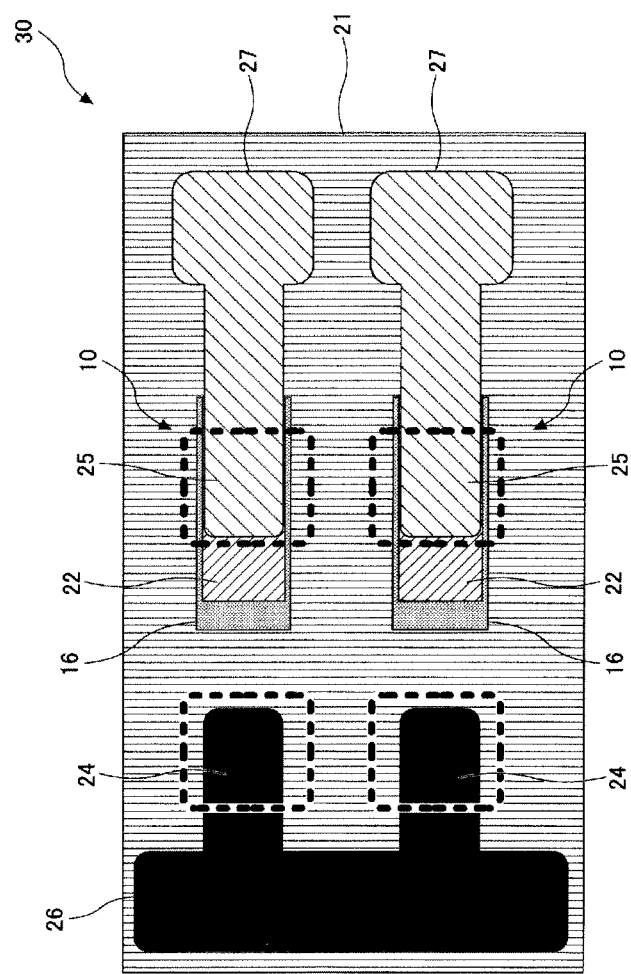

ELECTROMECHANICAL CONVERSION ELEMENT, LIQUID DROP EJECTION HEAD, LIQUID DROP EJECTION DEVICE, AND IMAGE FORMING APPARATUS

BACKGROUND OF THE INVENTION

1. Field of the Invention

An aspect of the present invention relates one of an electromechanical conversion element, a liquid drop ejection head, a liquid drop ejection device, and an image forming apparatus.

2. Description of the Related Art

Conventionally, such a liquid drop ejection head is known which includes a nozzle for ejecting a liquid drop, a pressurization chamber communicating with such a nozzle and containing an ink, etc., (an "ink" below) to provide a liquid drop, and an electromechanical conversion element such as a piezoelectric element or an electrothermal conversion element such as a heater, as a driving source for pressurizing an ink in such a pressurization chamber, or an energy generation part composed of a vibration plate for forming an ink flow channel and electrodes opposing it, wherein an ink in the pressurization chamber is pressurized by energy generated in the driving source or energy generation part to eject an ink drop from the nozzle. Additionally, such a pressurization chamber may also be referred to as an ink flow channel, a pressurization liquid chamber, a pressure chamber, an ejection chamber, or a liquid chamber, etc.

For an actuator which is used or may be used as such a driving source, a film structure such as a semiconductor device or an electronic device is known (see, for example, Japanese Patent Application Publication No. 2004-186646, Japanese Patent Application Publication No. 2004-262253, Japanese Patent Application Publication No. 2003-218325, Japanese Patent No. 3249496, Japanese Patent No. 3472087, Japanese Patent Application Publication No. 11-195768, Japanese Patent No. 4099818, Japanese Patent No. 3806127, Japanese Patent Application Publication No. 2003-282987, Japanese Patent Application Publication No. 2009-224368, Japanese Patent No. 4220459, Japanese Patent No. 3782401, Japanese Patent No. 4011334, and Japanese Patent Application Publication No. 2002-94018). For such an actuator, for example, two kinds thereof, that is, a piezoelectric actuator being used in a longitudinal oscillation mode in which a piezoelectric element expands or contracts in an axial direction thereof and a piezoelectric actuator being used in a flexural oscillation mode, have been in practical use.

For a piezoelectric actuator being used in a flexural oscillation mode, for example, a piezoelectric element is known which is formed by forming a uniform piezoelectric material layer over an entire surface of a vibration plate by a film formation technique and cutting such a piezoelectric material layer into a shape corresponding to a pressure generation chamber by a lithography method so as to provide each independent pressure generation chamber.

When a vector component of a spontaneous polarization axis of a piezoelectric film is coincident with a direction of an applied electric field in such a piezoelectric actuator, stretching caused by an increase or decrease in an intensity of an applied electric field may occur effectively to obtain a large piezoelectric constant, and hence, it may be most preferable to coincident a spontaneous polarization axis of a piezoelectric film with a direction of an applied electric field completely. Furthermore, it may be preferable to provide a small dispersion of an in-plane piezoelectric performance of a piezoelectric film in order to suppress a dispersion of an amount of an ejected ink, etc. When such a matter is taken into consideration, a piezoelectric film with an excellent crystal orientation may be preferable.

For a technique with respect to a crystal orientation, for example, a technique for film-forming a piezoelectric film on a Ti-containing noble metal electrode with an island-like Ti deposited on a surface thereof, thereby film-forming a piezoelectric film with an excellent crystal orientation (see, for example, Japanese Patent Application Publication No. 2004-186646), a technique for using a MgO substrate as a substrate thereby film-forming a piezoelectric film with an excellent crystal orientation (see, for example, Japanese Patent Application Publication No. 2004-262253), and a technique relating to a method for manufacturing a ferroelectric film wherein an amorphous ferroelectric film is film-formed and subsequently the film is crystallized by a rapid heating method (see, for example, Japanese Patent Application Publication No. 2003-218325) are known.

In many of such techniques, a PZT is fabricated on Pt, but, in such a case, it may be possible for an electrical characteristic such as a piezoelectric characteristic to be degraded, and hence, an electrode material of electrically conductive oxide such as $RuO_x$ or $IrO_2$ has been studied in a field of a ferroelectric memory, etc.

Among them, a strontium ruthenium oxide (SRO) has the same perovskite-type crystal structure as a PZT, and hence, may be excellent in a bonding property at an interface, be easy to realize epitaxial growth of a PZT, and also be excellent in a characteristic of a Pb diffusion barrier layer.

However, excess Pb contained in a PZT may react with Sr or Ru contained in a strontium ruthenium oxide to form a compound having an electrical conductivity. Accordingly, a withstand voltage of a PZT may be very bad to facilitate leaking thereof, and hence, an electrical characteristic such as a piezoelectric characteristic may be degraded. For a matter relevant to such a thing, for example, it is reported in detail that an influence with an amount of excess Pb in a PZT may also be provided wherein it may be possible to suppress Sr diffusion after post-annealing in a case of a less amount of excess Pb (see, for example, Jpn. J. Appl. Phys. Vol. 40 (2001) pp. L346-348). Furthermore, when a PZT is fabricated by a solution method such as a spin-coat method, a thermal process at a crystallization temperature of 550° C. or higher may be involved and it may also be possible to suppress Sr diffusion depending on a baking temperature or a baking time at such a case. However, when an amount of excess Pb is in the range as described in the above-mentioned report, a sufficient initial deformation may not be obtained in a case where use is made as a piezoelectric actuator and a deficiency of degraded deformation may occur in a case where a continuous operation is further conducted.

For a technique using strontium ruthenium oxide having a perovskite structure, there are provided, for example, a technique relating to a semiconductor device having at least one of upper and lower electrodes including a SRO and a capacitor configured to interpose a dielectric film (technique A: see, for example, Japanese Patent No. 3219496), a technique relating to a structure for which an epitaxial film (100) based on a SRO is fabricated on a Si (100) substrate so that its surface roughness (average roughness) is 10 nm or less (technique B: see, for example, Japanese Patent No. 3472087), and a technique relating to a structure including a perovskite-type oxide film for which a SRO is sputtered for film formation to fabricate amorphous films as lower and upper electrodes without actively heating a substrate and subsequently is annealed at a crystallization temperature (technique C: see, for example, Japanese Patent Application Publication No. 11-195768).

However, although an RTA treatment for formation of a SRO film is conducted after film formation at a room temperature in technique A, it could be found that it may be difficult to obtain (111) orientation when a PZT is fabricated on a SRO. Furthermore, it has been found that when a thickness of a SRO film is 10-20 nm, it may not possible to obtain a sufficient initial deformation in case where use is made as a piezoelectric actuator and a deficiency may occur in a case of a further continuous operation.

Furthermore, although a SRO is used for a lower electrode in technique B, there is no description of a SRO being used for an upper electrode. From the viewpoint of the above-mentioned characteristic of a SRO as a Pb diffusion barrier layer, it may be preferable to use a SRO also for an upper electrode. Furthermore, although a ferroelectric film fabricated on an epitaxial film (100) has (100) orientation, it could be found that (111) orientation of a piezoelectric film may be preferable in order to suppress degradation of a deformation characteristic in a case where a continuous operation is conducted as a piezoelectric actuator while it may not be possible for (100) orientation to suppress such a degradation sufficiently.

Furthermore, in technique C, it could be found that it may be difficult to obtain (111) orientation in a case where a PZT is fabricated on a SRO and degradation more than an initial deformation may be caused in a continuous operation in a case where use is made as a piezoelectric actuator, so that a deficiency may be caused.

SUMMARY OF THE INVENTION

According to one aspect of the present invention, there is provided an electromechanical conversion element, including an electromechanical conversion film including a PZT, an upper electrode formed on a top of the electromechanical conversion film and including a first strontium ruthenium oxide, and a lower electrode formed on a bottom of the electromechanical conversion film and including a second strontium ruthenium oxide, wherein Sr-pzt/Sr-sr≤0.01, wherein Sr-pzt is a SIMS intensity for a secondary ion of strontium of the PZT at a position of ½ of a thickness of the electromechanical conversion film and Sr-sr is a SIMS intensity for a secondary ion of strontium of the second strontium ruthenium oxide at a position of ½ of a thickness of the lower electrode.

According to another aspect of the present invention, there is provided a liquid drop ejection head, including the electromechanical conversion element as described above and a driving part configured to drive the electromechanical conversion element to eject a liquid drop.

According to another aspect of the present invention, there is provided a liquid drop ejection device, comprising the liquid drop ejection head as described above and a liquid supply part configured to supply a liquid for a liquid drop to the liquid drop ejection head.

According to another aspect of the present invention, there is provided an image forming apparatus, comprising the liquid drop ejection device as described above.

BRIEF DESCRIPTION OF THE DRAWINGS

FIGS. 7A and 7B are schematic diagrams of cross-sections of another example of an electromechanical conversion element on which an embodiment of the present invention has been applied.

DETAILED DESCRIPTION OF THE PREFERRED EMBODIMENTS

Figure 1:
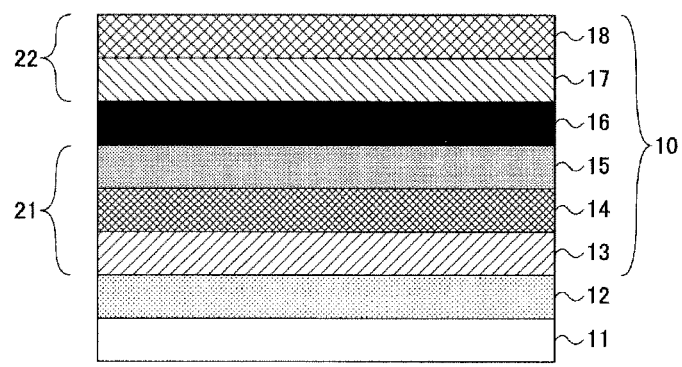
FIG. 1 is a schematic diagram of a cross-section of one example of an electromechanical conversion element on which an embodiment of the present invention has been applied.

FIG. 1 schematically illustrates a cross-section of an example of an electromechanical element to which an embodiment of the present invention has been applied. An electromechanical conversion element 10 includes a bonding layer 13 formed on a vibration plate 12 as an underlying film on a substrate 11, a first electrode 14 formed on the bonding layer 13, a second electrode 15 formed on the first electrode 14, an electromechanical conversion film 16 formed on the second electrode 15, a third electrode 17 formed on the electromechanical conversion film 16, and a fourth electrode 18 formed on the third electrode 17.

The electromechanical conversion element 10 is formed by a technique used for manufacturing a film structure such as a semiconductor manufacturing process, wherein the bonding layer 13, the first electrode 14, the second electrode 15, the electromechanical conversion film 16, the third electrode 17, and the fourth electrode 18 are film-formed in this order on the vibration plate 12 which is a film formation vibration plate film-formed on the substrate 11.

Hence, the first electrode 14 is formed indirectly on the vibration plate 12 through the bonding layer 13. However, the first electrode 14 may be formed directly on the vibration plate 12 while the bonding layer 13 is omitted. Furthermore, the bonding layer 13 may constitute the first electrode 14. Furthermore, the vibration plate 12 may be omitted, and in such a case, the first electrode 14 is formed directly on the substrate 11 or indirectly through the bonding layer 13.

The electromechanical conversion element 10 is a piezoelectric element wherein the bonding layer 13, the first electrode 14, and the second electrode 15 are included as a lower electrode 21 and the third electrode 17 and the fourth electrode 18 are included as an upper electrode 22, while the electromechanical conversion film 16 is included as a piezoelectric film. The third electrode 17 and the fourth electrode 18 are separate electrodes and the upper electrode 22 is a separate electrode.

Figure 2:
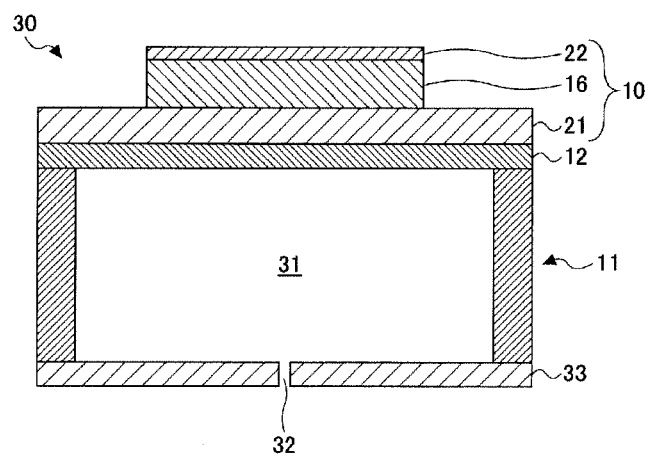
FIG. 2 is a schematic diagram of a cross-section of one example of a liquid drop ejection head with an electromechanical conversion element as illustrated in FIG. 1.
Figure 3:
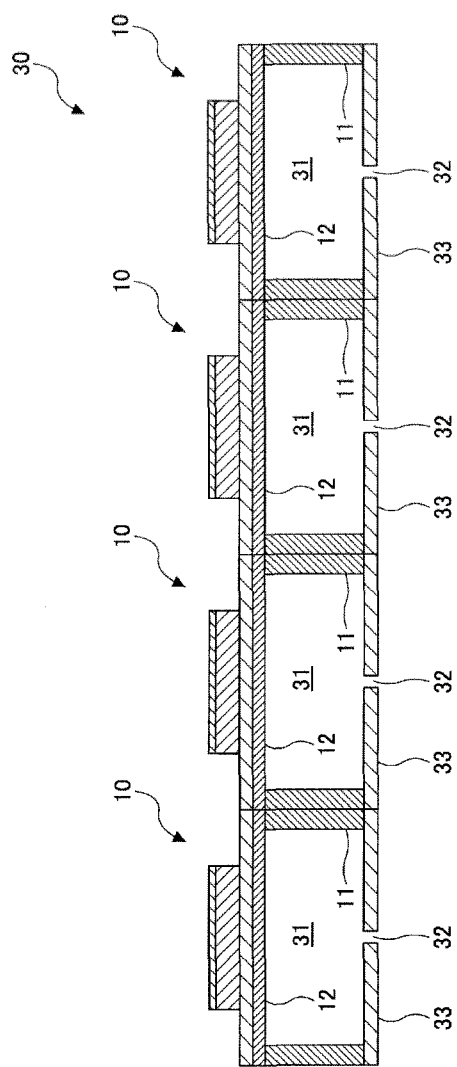
FIG. 3 is a schematic diagram of a cross-section of another example of a liquid drop ejection head with an electromechanical conversion element as illustrated in FIG. 1.

As illustrated in FIG. 2 and FIG. 3, it may be possible to use the electromechanical conversion element 10 as a part of a liquid drop ejection head 30 which is a liquid jetting head. Additionally, the liquid drop ejection head 30 illustrated in FIG. 2 schematically is one example of a one-nozzle structure, and FIG. 3 schematically illustrates the liquid drop ejection head 30 formed by arranging a plural of elements illustrated in FIG. 2.

The liquid drop ejection head 30 includes the electromechanical conversion element 10 and vibration plate 12 which function as its driving source as well as a pressure chamber 31 as a pressure chamber which is formed by etching the substrate 11 on which the electromechanical conversion element 10 is formed, as described below, and is an ink chamber for containing a liquid such as an ink (referred to as an "ink" below), and a nozzle plate 33 as an ink nozzle including a nozzle 32 which is a nozzle opening as an ink ejection port for ejecting an ink in the pressure chamber 31 as a liquid drop.

The liquid drop ejection head 30 is a head for ejecting a liquid drop of ink from the nozzle 32 by driving the electromechanical conversion element 10. Specifically, in the liquid drop ejection head 30, the lower electrode 21 and the upper electrode 22 are power-supplied as described below so as to cause a stress in the electromechanical conversion film 16, thereby vibrating the vibration plate 12, and due to such vibration, an ink in the pressure chamber 31 is ejected from the nozzle 32 as a liquid drop. Additionally, an illustration and description of a liquid supply part which is an ink supply part for supplying an ink in the pressure chamber 31, an ink channel, and a fluid resistance are omitted.

The electromechanical conversion element 10 generally includes the first electrode 14 and the fourth electrode 18 as metal electrodes and includes the second electrode 15 and the third electrode 17 as oxide electrodes. The electromechanical conversion film 16 is composed of a PZT.

Materials, film formation conditions, orientations, etc., for the substrate 11, the vibration plate 12, the bonding layer 13, the first electrode 14, the second electrode 15, the electromechanical conversion film 16, the third electrode 17, and the fourth electrode 18 will be described more specifically below.

For the substrate 11, it is preferable to use a silicon single crystal substrate and it is normally preferable to have a thickness of 100-600 µm. For a plane orientation thereof, there are three kinds of (100), (110), and (111), wherein (100) and (111) are generally and widely used in a semiconductor industry, and in the present configuration, a single crystal substrate having a plane orientation of (100) is mainly used.

When a pressure chamber such as the pressure chamber 31 illustrated in FIG. 2 and FIG. 3 is fabricated, a silicon single crystal substrate is processed by utilizing etching, and for an etching method in this case, it is common to use an anisotropic etching. An anisotropic etching is to utilize a property of different etching rates of plane orientations of a crystal structure. For example, in an anisotropic etching with dipping in a solution of an alkali such as KOH, a (111) plane has an etching rate of about 1/400 compared to that of a (100) plane. Therefore, it may be possible to make a deep groove with respect to a plane orientation of (110) whereas a structure having an inclination of about 54.74° is fabricated with respect to a plane orientation of (100), and hence, it has been found that it may be possible to increase a density of orientation while keeping rigidity more certainly. Hence, in the present configuration, it may also be possible to use a single crystal substrate with a plane orientation of (110). However, in such a case, $SiO_2$ which is a mask material is also etched, and hence, and is used while such a matter is noted.

The vibration plate 12 receives a power generated by the electromechanical conversion film 16 so as to deform and elect an ink in the pressure chamber 31 as an ink drop. Accordingly, it is preferable for the vibration plate 12 to have a predetermined strength. For a material thereof, Si, $SiO_2$, or $Si_3N_4$ fabricated by a CVD method is provided.

For a material of the vibration plate 12, moreover, it is preferable to select a material with a linear expansion coefficient close to that of the lower electrode 21 or electromechanical conversion film 16. In particular, a PZT is generally used for a material of the electromechanical conversion film 16, and hence, for the vibration plate 12, a material having a linear expansion coefficient of $5\times10^{-6}$-$10\times10^{-6}$ as a linear explanation coefficient close to a linear expansion coefficient of $8\times10^{-6}$ (1/K) of a PZT is preferable, and moreover, a material having a linear expansion coefficient of $7\times10^{-6}$-$9\times10^{-6}$ is more preferable.

For a specific material of the vibration plate 12, there are provided an aluminum oxide, a zirconium oxide, an iridium oxide, a ruthenium oxide, a tantalum oxide, a hafnium oxide, an osmium oxide, a rhenium oxide, a rhodium oxide, a palladium oxide, and compounds thereof, etc., and it may be possible to conduct fabrication thereof by a sputtering method or a spin-coater using a sol-gel method. For a film thickness thereof, 0.1-10 µm is preferable and 0.5-3 µm is more preferable. This is because it may be difficult to process a pressure chamber such as the pressure chamber 31 in a case of being less than such a range and it may be difficult to deform itself in a case of being greater than such a range so that ejection of an ink drop may be unstable.

For a metal material composing the first electrode 14 or the fourth electrode 18, a platinum having a high heat resistance and a low reactivity has been used conventionally but may not have a sufficient barrier property against a lead. Hence, for a metal material composing the first electrode 14 or the fourth electrode 18, a platinum-group metal such as an iridium or a platinum-rhodium or an alloy film thereof is also provided, and in particular, it is preferable to be composed of a Pt-group element.

For a method for fabricating the first electrode 14 or the fourth electrode 18, a sputtering method or a vacuum film formation such as a vacuum deposition is general. For a film thickness of the first electrode 14 or fourth electrode 18, 0.05-1 µm is preferable and 0.1-0.5 µm is more preferable. Furthermore, in such a case, it is preferable for its crystalline property to have a (111) orientation when a PZT is selected for the electromechanical conversion film 16. Accordingly, for a material of the first electrode 14, it is preferable to select a Pt with a high (111) orientation property, and hence, in the present configuration, the first electrode 14 is composed of a Pt with a high (111) orientation property.

The bonding layer 13 is formed by laminating Ti, $TiO_2$, Ta, $Ta_2O_5$, $Ta_3N_5$, etc., prior to the first electrode 14. This is because a base such as the vibration plate 12, in particular, a base formed of $SiO_2$, may have a low binding property with the first electrode 14, in a case where a platinum is used for the first electrode 14.

For the second electrode 15 or the third electrode 17, a $SrRuO_3$ which is a strontium ruthenium oxide is used for a material thereof. The second electrode 15 has a (111) orientation having a perovskite structure as will be clarified below, wherein a surface roughness thereof is 4 nm or greater and 15 nm or less and a thickness thereof is 40 nm or greater and 150 nm or less. Furthermore, the third electrode 17 has a (110) orientation having a perovskite structure as will be clarified below, wherein a surface roughness thereof is 3 nm or less and a thickness thereof is 40 nm or greater and 80 nm or less. Additionally, for another material of the second electrode 15 or the third electrode 17, a material represented by $Sr_x(A)_{(1-x)}Ru_y(B)_{(1-y)}$, A=Ba or Ca, B=Co or Ni, x, y=0-0.5, is provided.

A method for film formation of the second electrode 15 or third electrode 17 is a sputtering method. A film quality of a SrRuO₃ thin film is changed depending on a sputtering condition, and in particular, where a crystal orientation property is emphasized, it is preferable to conduct heating of a substrate at 500° C. or higher as a film formation temperature and film formation in order to provide a SrRuO₃ film with a (111) orientation like a Pt (111) for a first electrode. However, in the present configuration, a (111) orientation of the second electrode 15 is a preferential orientation, while the third electrode 17 has a perovskite structure similarly to the second electrode 15 but a preferential orientation thereof is a (110) orientation so that a preferentially orienting crystal axis thereof is different from that of the second electrode 15, and hence, heating of a substrate at 300° C. or less is conducted as will be described below.

In this respect, for a condition of SRO film formation in the above-mentioned technique B, film formation is conducted at a room temperature and subsequently thermal oxidation is conducted at a crystallization temperature (650° C.) by an RTA treatment. In such a case, a SRO film is sufficiently crystallized and a sufficient value of a resistivity of an electrode is also obtained but it may be easy for (110) to be an preferential orientation with respect to a crystal orientation property of such a film and it may also be easy for a PZT film formed thereon to have a (110) orientation.

For a crystal property of a SRO fabricated on a Pt (111), a Pt and a SRO have close lattice constants, and hence, positions of 2θ for a SRO (111) and a Pt (111) on a usual θ-2θ measurement overlap so that it may be difficult to provide a discrimination therebetween. For a Pt, diffracted lines are canceled at a position at where a 2θ inclined by a Psi=35° is near about 32° in accordance with an extinction rule and a diffraction intensity is not found. Accordingly, a decision may be made by a peak intensity in a case where a direction of Psi is inclined by about 35° and a 2θ is near about 32°, whereby it may be possible to confirm whether a SRO has a preferentially orienting (111).

Figure 4:
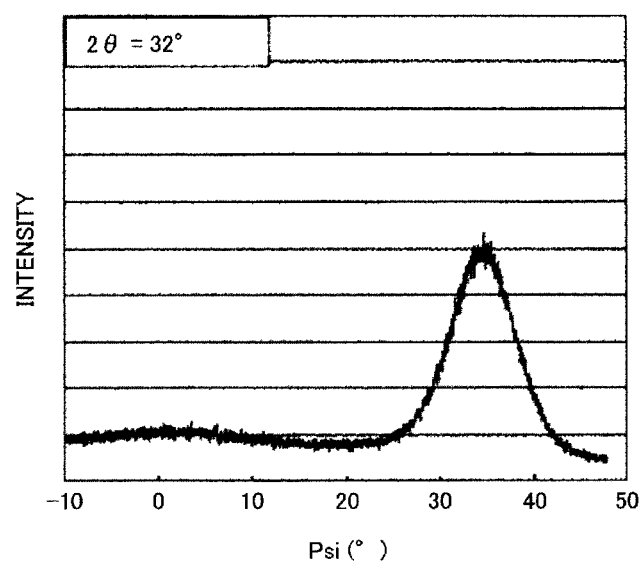
FIG. 4 is a diagram illustrating a result of a measurement for identifying a degree of orientation of an electromechanical conversion element as illustrated in FIG. 1.

FIG. 4 illustrates data in a case where 2θ=32° is fixed and a Psi is varied. A diffraction intensity for a SRO (110) is hardly found at Psi=0° and a diffraction intensity is found near Psi=35°, whereby it is confirmed that a SRO fabricated on the present film formation condition has a (111) orientation. Furthermore, a diffraction intensity for a SRO (111) is found at Psi=0° for a SRO fabricated by the above-mentioned room temperature film formation and RTA treatment.

Additionally, when the second electrode 15 has a (110) orientation, the following is provided. That is, as will be described in detail below, when the electromechanical conversion element 10 is continuously operated as a piezoelectric actuator for the liquid drop ejection head 30, how much an amount of deformation after driving is degraded compared to an initial deformation is estimated, and as a result, it is found that there may be much influence of an orientation of a PZT and the second electrode 15 has a (110) orientation whereby when a PZT has a (110) orientation, it may be insufficient to suppress degradation of a deformation.

Furthermore, when the second electrode 15 has a (110) orientation and a surface roughness of a SRO film is found, such a surface roughness influences a film formation temperature, wherein a surface roughness is very small and 2 nm or less from a room temperature to 300° C. For a roughness, in the present description, a surface roughness (average roughness) measured by an AFM is provided as an index. A surface roughness may indicate very flat, but a crystal property may not be sufficient so that a sufficient characteristic may not be obtained for an initial deformation of a PZT film formed thereafter as a piezoelectric actuator or degradation of a deformation thereof after continuous driving thereof.

For a surface roughness of the second electrode 15, it is preferable to be 4 nm-15 nm, wherein 6 nm-10 nm is more preferable. In a case of being greater than such a range, a withstand voltage of a PZT film formed thereafter may be very bad and may be easy to leak. Hence, film formation is conducted in a range of 500-700° C. as a film formation temperature, and preferably 520-600° C., in order to obtain a crystal property or surface roughness as described above.

For a film thickness of a SRO film for the second electrode 15, 40 nm or greater and 150 nm or less is preferable and 50 nm or greater and 60 nm or less is more preferable. In a case of being thinner than such a range of film thickness, an orientation of a PZT may be unstable and a sufficient characteristic may not be obtained for an initial deformation or degradation of a deformation after continuous driving. In a case of being greater than such a range, a withstand voltage of a PZT film formed thereafter may be very bad and it may be easy to leak.

For a film thickness of a SRO film for the third electrode 17, 40 nm or greater and 80 nm or less is preferable and 50 nm or greater and 60 nm or less is more preferable. In a case of being thinner than such a range of film thickness, a sufficient characteristic may not be obtained for an initial deformation or a deformation degradation characteristic. In a case of being greater than such a range, a withstand voltage of a PZT film formed thereafter may be very bad and it may be easy to leak.

A SRO film for the third electrode 17 is film-formed by conducting heating of a substrate at a film formation temperature of 300° C. or lower. It is not necessary to be a film with a preferentially orienting (111) like a second electrode. When a value of a resistivity of $10^{-3}$ Ω·cm order is obtained for such an electrode, such a level is not problematic in order to operate as a piezoelectric actuator. After fabrication on the above-mentioned film formation condition, thermal oxidation at a crystallization temperature (550° C.) is conducted by an RTA treatment, so that a film with a resistivity at the above-mentioned level is provided and a SRO film has a preferentially orienting (110).

Figure 5:
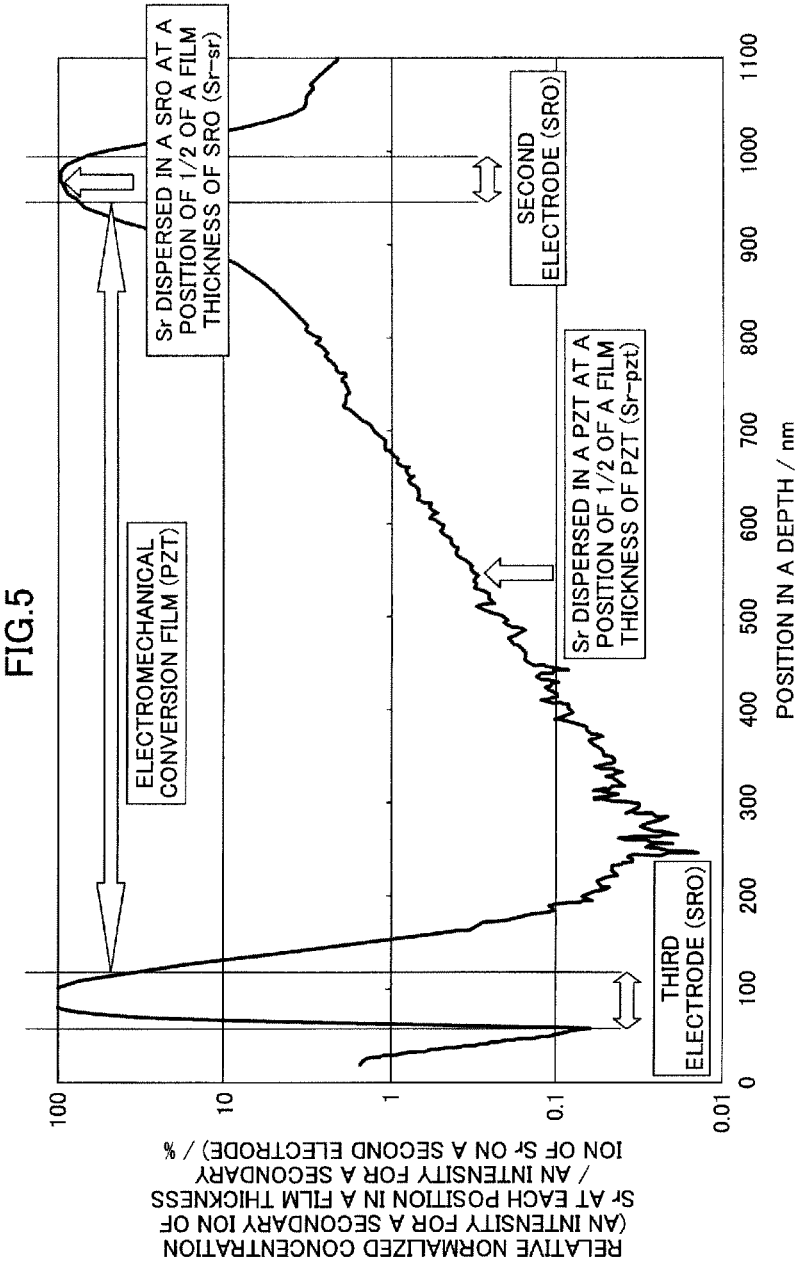
FIG. 5 is a diagram illustrating a distribution of strontium in an electromechanical conversion element as illustrated in FIG. 1.

For a surface roughness of the third electrode 17, it is preferable to be 3 nm or less, and in a case of being greater than such a value, a withstand voltage of a PZT film formed thereafter may be very had and it may be easy to leak. Herein, FIG. 5 illustrates a result of a Sr distribution in a direction of a depth of a film, that is, a vertical direction in FIG. 1 through FIG. 3 from the fourth electrode 18 toward the first electrode 14, as measured by using a Secondary Ion Mass Spectrometry (SIMS). A transverse axis of a graph in the same figure indicates a film thickness converted from a sputtering time period and a longitudinal axis indicates a relative value of an intensity for a secondary ion of Sr contained in strontium ruthenium oxide in each film, that is, the electromechanical conversion film 16 or the third electrode 17 to an intensity for a secondary ion of strontium ruthenium oxide at a central position of the second electrode 15 when being represented by using an intensity ratio for a secondary ion of Sr in an Inductively Coupled Plasma (ICP) emission spectrometry.

Herein, when an ion intensity for a secondary ion of strontium positioned at ½ of a film thickness of a PZT for the electromechanical conversion film 16 in a direction of depth as described above is Sr-pzt and an ion intensity for a secondary ion of strontium positioned at ½ of a film thickness of a strontium ruthenium oxide for the second electrode 15 in a direction of depth as described above is Sr-sr, it is preferable for Sr-pzt/Sr-sr which indicates diffusion of Sr to be 0.01 or less, that is, to be Sr-pzt/Sr-sr≤0.01, wherein in a case of being greater than such a value, a withstand voltage of a PZT film formed thereafter may be very bad and it may be easy to leak.

For a composition ratio of Sr to Ru in the second electrode 15 or third electrode 17 after film formation thereof, it is preferable for Sr/Ru to be 0.82 or greater and 1.22 or less. In a case of deviating from such a range, a resistivity thereof may be large and a sufficient electrical conductivity for such an electrode may not be obtained.

For the electromechanical conversion film 16, a PZT is used. A PZT is a solid solution of a lead zirconium oxide ($PbZrO_3$) and a lead titanium oxide (PbTiO3) and a characteristic thereof is different depending on a ratio thereof. In general, a composition exhibiting an excellent piezoelectric characteristic is a proportion such that a ratio of a $PbZrO_3$ to a $PbTiO_3$ is 53:47, and when a chemical formula thereof is indicated, a representation is provided by Pb(Zr0.53, Ti0.47) $O_3$, generally PZT (53/47). For a complex oxide other than a PZT, a barium titanium oxide, etc., is provided, and in such a case, it may also be possible to provide a barium alkoxide or titanium alkoxide compound as a starting material and conduct dissolution thereof in a common solvent so as to prepare a solution of a barium titanium oxide precursor.

Such a material is represented by a general formula of $ABO_3$ and corresponds to a complex oxide with main components of A=Pb, Ba, or Sr and B=Ti, Zr, Sn, Ni, Zn, Mg, or Nb. A specific representation thereof is $(Pb_{1-x}, Ba) (Zr, Ti) O_3$ or $(Pb_{1-x}, Sr) (Zr, Ti) O_3$, which is a case a part of Pb in site A is replaced with Ba or Sr. Such a replacement may be possible for a divalent element, and an indicated effect thereof may be an action for reducing characteristic degradation caused by evaporation of lead during a heat treatment.

For a fabrication method, it may be possible to conduct fabrication by a sputtering method or a spin-coater using a sol-gel method. In such a case, patterning may be needed and a desired pattern may be obtained by a photolithographic etching, etc.

When a PZT is fabricated by a sol-gel method, starting materials are lead acetate, zirconium alkoxide, and titanium alkoxide compounds and the starting materials are dissolved in methoxyethanol as a common solvent so as to obtain a uniform solution thereby preparing a PZT precursor solution. A metal alkoxide compound may be readily hydrolyzed by a moisture in an atmosphere, and hence, a suitable amount of a stabilizing agent such as acetylacetone, acetic acid, or diethanolamine may be added to such a precursor solution as a stabilizer.

When a PZT film is obtained on an entire face of an underlying substrate, a coating film may be formed and obtained by a solution applying method such as spin-coating and applying each heat treatment of solvent drying, thermal decomposition, and crystallization. A transformation from a coating film to a crystallization film is involved with a volume shrinkage, and hence, adjustment of a concentration of a precursor may be needed so that a film thickness of 100 nm or less is obtained in one process, in order to obtain a crack-free film.

Furthermore, when fabrication is conducted by an ink-jet process or method, it may be possible to obtain a film patterned in a fabrication flow similar to that of the second electrode 15. A surface modification material is also different depending on a material of the first electrode 14 as a base, wherein a silane compound is mainly selected in a case where such a base is an oxide and an alkanethiol is mainly selected in a case where such a base is a metal.

For a film thickness of the electromechanical conversion film 16, 0.5-5 µm is preferable and 1 µm-2 µm is more preferable. In a case of being less than such a range, it may be possible to cause a sufficient deformation, and in a case of being greater than such a range, many layers may be laminated so that the number of processes may increase and a process time may increase.

Figure 6:
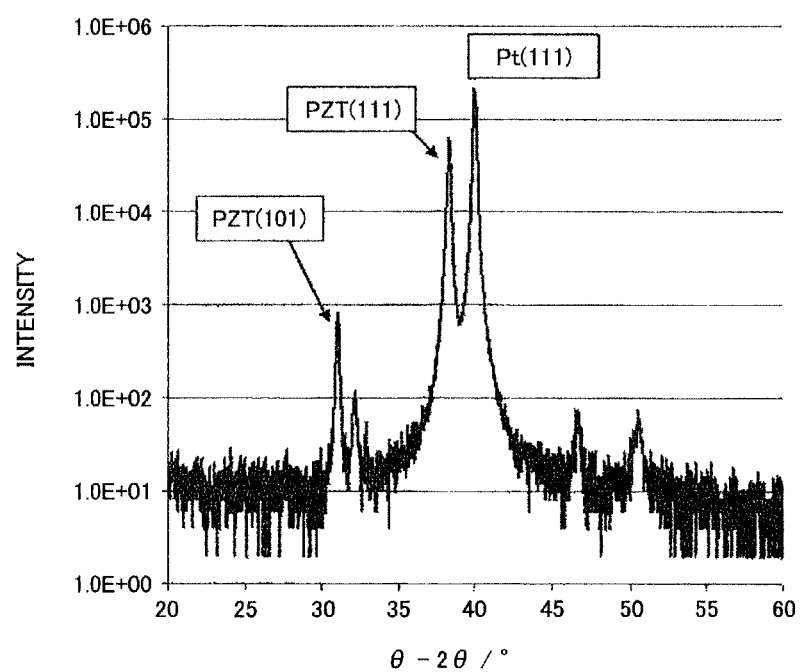
FIG. 6 is a diagram illustrating a result of a measurement of a peak for each orientation of an electromechanical conversion element as illustrated in FIG. 1.

FIG. 6 illustrates an XRD after a 1 µm PZT film is formed on the second electrode 15 by spin-coating using a solution prepared by a sol-gel method. From the figure, it is found that a PZT film with a very preferentially orienting (111) plane is obtained. Furthermore, a film with an orientation other than (111) is also provided depending on a condition of heat treatment for a PZT, and when the following formula is used, it is preferable that a degree of (111) orientation is 0.95 or greater a degree of (110) orientation is 0.05 or less.

Such a formula indicates a calculation method for indicating a ratio of respective orientations in a case where a sum of peaks for respective orientations obtained by an XRD is 1. a value obtained by such a formula represents an average degree of orientation.

$\rho = I(hkl)/\Sigma I(hkl)$

A denominator: a sum of respective peak intensities
A numerator: a peak intensity for an arbitrary orientation
In case of being greater than such a range, it is found that a sufficient characteristic may not be obtained for degradation of a deformation after continuous driving.

As being found from the above description(s), it may be possible to form the electromechanical conversion element 10 in a simple manufacturing process and have a performance comparable to a bulk ceramic, and it may be possible to manufacture the liquid drop ejection head 30 by a subsequent etching removal from a back face to form the pressure chamber 31 and joining of the nozzle plate 33 having the nozzle 32 thereto.

Practical examples of an embodiment(s) of the present invention and Comparative examples to be compared with the Practical examples will be described below.

In such examples, a structure of an electromechanical conversion element is provided as illustrated in FIGS. 7A and 7B. FIG. 7A is a cross-sectional diagram corresponding to FIG. 1 through FIG. 3 and FIG. 7B is a plan view with omitted illustration of one layer as described below.

Additionally, a part having already been described with reference to FIG. 1 through FIG. 3 is provided with the same reference numeral as the reference numeral provided with such a part and its description(s) will be omitted appropriately. For a matter having not been described in the following description(s) with reference to FIGS. 7A and 7B, a matter having already been described is referred to appropriately.

As illustrated in the same figures, an electromechanical conversion element 10 includes an insulating protective film 23 (whose illustration is omitted in FIG. 7B) formed to cover a lower electrode 21, an electromechanical conversion film 16, and an upper electrode 22 from a top thereof, contact holes 24 and 25 formed on the insulating protective film 23, a fifth electrode 26 located in the contact hole 24, electrically conducting with the lower electrode 21, and having another portion formed above the insulating protective film 23, and a sixth electrode 27 located in the contact hole 25, electrically conducting with the upper electrode 22, and having another portion formed above the insulating protective film 23.

The fifth electrode 26 is a common electrode, and accordingly, the lower electrode 21 functions as a common electrode.

The sixth electrode 27 is a separate electrode, and accordingly, the upper electrode 22 functions as a separate electrode.

Practical Example 1

A vibration plate 12 which was a thermal oxidation film with a film thickness of 1 µm was formed on a silicon wafer as a substrate 11, and a bonding layer 13 which was a titanium film with a film thickness of 50 nm and a platinum film with a film thickness of 250 nm as a first electrode 14 were further film-formed by sputtering. The titanium film which was the bonding layer 13 was a bonding layer between the thermal oxidation film and the platinum film.

Then, a SrRuO film with a film thickness of 50 nm as a second electrode 15 was film-formed by sputtering. In film formation by sputtering, such film formation was conducted at a substrate heating temperature of 550° C.

For manufacturing an electromechanical conversion film 16, a solution formulated at a composition ratio of Pb:Zr:Ti=110:53:47 was prepared. For a specific synthesis of a precursor application liquid, lead acetate trihydrate, titanium isopropoxide, and zirconium isopropoxide were used as starting materials. With respect to water of crystallization, dehydration was conducted after dissolution in methoxyethanol. The amount of lead was excessive with respect to a stoichiometric composition. This was because degradation of a crystal property caused by so-called "lead elimination" during heat treatment was prevented. Titanium isopropoxide and zirconium isopropoxide were dissolved in methoxyethanol to promote an alcohol exchange reaction and an esterification reaction and the above-mentioned solution of lead acetate dissolved in methoxyethanol was mixed thereto to prepare a PZT precursor solution. A concentration of such a OPT was 0.5 mole/liter. An electromechanical conversion film 16 was film-formed by spin-coating using such a solution, and after film formation, drying at 120° C. to thermal decomposition at 500° C. were conducted. After thermal decomposition treatment for a third layer, a crystallization heat treatment at a temperature of 750° C. was conducted in an RTA which was a rapid heat treatment. Herein, a film thickness of PZT was 240 nm. Such a process was conducted repeatedly eight times, a PZT film composed of 24 layers and having a thickness of about 2 μm was obtained.

Then, a SrRuO film with a film thickness of 40 nm as a third electrode 17 was film-formed by sputtering. For a substrate temperature for film formation by sputtering, film formation was conducted at 300° C. Subsequently, an RTA treatment was conducted at 550° C./300 s under oxygen atmosphere as a post-anneal treatment.

Then, a Pt film with a film thickness of 125 nm as a fourth electrode 18 was film-formed by sputtering.

Subsequently, after a film was formed by a spin-coat method from a photoresist produced by TOKYO OHKA KOGYO Co., Ltd. (TSMR8800) and a resist pattern was formed by a normal photolithography, a pattern necessary to provide a configuration illustrated in FIGS. 7A and 7B was fabricated by using an ICP etching apparatus (produced by SAMCO Inc.).

Then, a parylene film with a film thickness of 2 μm as an insulating protective film 23 was film-formed by a CVD.

Subsequently, after a film was formed by a spin-coat method from a photoresist produced by TOKYO OHKA KOGYO Co., Ltd. (TSMR8800) and a resist pattern was formed by a normal photolithography, a pattern necessary to provide a configuration illustrated in FIGS. 7A and 7B was fabricated by using an RIE (produced by SAMCO Inc.).

Finally, Al films with a film thickness of 5 μm as a fifth electrode 26 and a sixth electrode 27 were film-formed by sputtering.

Herein, after a film was formed by a spin-coat method from a photoresist produced by TOKYO OHKA KOGYO Co., Ltd. (TSMR8800) and a resist pattern was formed by a normal photolithography, a pattern necessary to provide a configuration illustrated in FIGS. 7A and 7B was fabricated by using an RIE (produced by SAMCO Inc.).

As described above, an electromechanical conversion element 10 was fabricated.

Practical Example 2

An electromechanical conversion element 10 was fabricated similarly to Practical example 1 except that a SrRuO film as a third electrode 17 was film-formed to have a film thickness of 80 nm by sputtering on a condition similar to that of Practical example 1.

Practical Example 3

An electromechanical conversion element 10 was fabricated similarly to Practical example 1 except that a SrRuO film as a third electrode 17 was film-formed to have a film thickness of 80 nm by sputtering on a condition of a substrate temperature of 200° C.

Comparative Example 1

An electromechanical conversion element was fabricated similarly to Practical example 1 except that a SrRuO film as a third electrode was film-formed by sputtering on a condition of a substrate temperature of 650° C. but a subsequent RTA treatment was not conducted. This comparative example is to be compared with the practical examples with respect to a surface roughness of a third electrode, a value of Sr-pzt/Sr-sr, a residual dielectric polarization as described below, and a piezoelectric constant.

Comparative Example 2

An electromechanical conversion element was fabricated similarly to Practical example 1 except that a SrRuO film as a third electrode was film-formed to have a film thickness of 200 nm by sputtering on a condition of a substrate temperature of 300° C., and after fabrication, an RTA treatment was conducted at 750° C./300 s under oxygen atmosphere as a post-anneal treatment. This comparative example is to be compared with the practical examples with respect to a film thickness and surface roughness of a third electrode, a value of Sr-pzt/Sr-sr, a residual dielectric polarization as described below, and a piezoelectric constant.

Comparative Example 3

An electromechanical conversion element was fabricated similarly to Practical example 1 except that a SrRuO film as a third electrode was film-formed to have a film thickness of 20 nm by sputtering on a condition similar to that of Practical example 1. This comparative example is to be compared with the practical examples with respect to a film thickness of a third electrode, a residual dielectric polarization as described below, and a piezoelectric constant.

Figure 8:
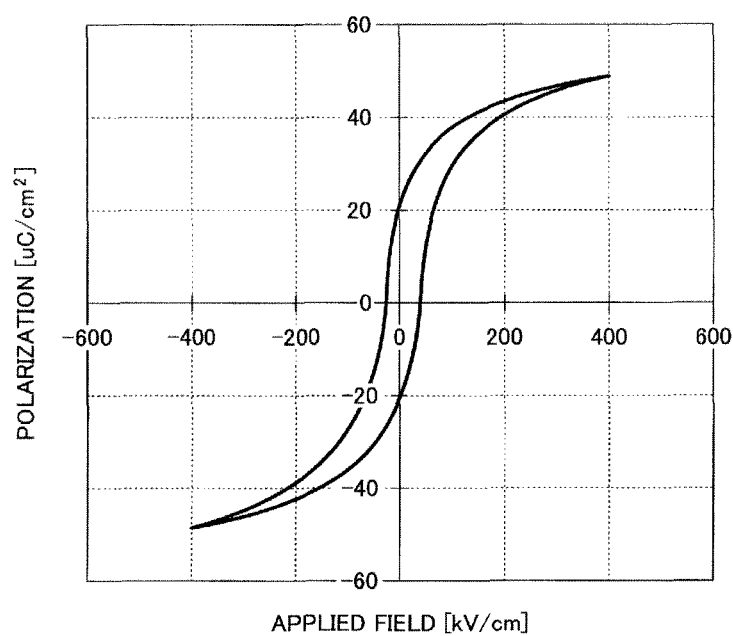
FIG. 8 is a diagram illustrating a typical P-E hysteresis curve in a case where an evaluation of a characteristic of an electromechanical conversion element is conducted.

An evaluation of a surface roughness for the electromechanical conversion elements fabricated by Practical examples 1-3 and Comparative examples 1-3 was conduced by using an AFM immediately after a third electrode was film-formed in the course of such a process (after an RTA treatment except Comparative example 1). Such a surface roughness is an average roughness. Furthermore, an evaluation of diffusion of Sr was conducted by using a SIMS immediately after a fourth electrode was film-formed. Evaluations of an electrical characteristic and an electromechanical conversion capability (piezoelectric constant) were conducted by using fabricated electromechanical conversion elements. FIG. 8 illustrates a representative P-E hysteresis curve. A degree of deformation caused by application of an electric field (150 kV/cm) was measured by a laser Doppler vibrometer and an electromechanical conversion capability was calculated by fitting on a simulation. After an initial characteristic was evaluated, an evaluation of a durability (a characteristic immediately after an application voltage was repeatedly applied $10^{10}$ times) was conducted.

Such detailed results are summarized in Table 1.

Additionally, in the same table, a numerical value in a bold frame indicates that a characteristic was degraded. An item for which a numerical value was not described in a bold frame indicates a case where an evaluation could not be provided in a test.

TABLE 1

|  | Film thickness | Roughness (average roughness) | Sr-pzt/Sr-sr (%) |
|---|---|---|---|
| Practical example 1 | 40 | 1.2 | 0.50 |
| Practical example 2 | 80 | 2.3 | 0.87 |
| Practical example 3 | 40 | 0.8 | 0.31 |
| Comparative example 1 | 40 | 6.8 | 2.50 |
| Comparative example 2 | 200 | 5.8 | 2.87 |
| Comparative example 3 | 20 | 1.2 | 0.25 |

|  | Pr | | d31 (pm/V) | |
|---|---|---|---|---|
|  | Initial | After $10^{10}$ times | Initial | After $10^{10}$ times |
| Practical example 1 | 24 | 23 | -155 | -152 |
| Practical example 2 | 25 | 24 | -152 | -149 |
| Practical example 3 | 23 | 22 | -158 | -156 |
| Comparative example 1 | 24 | — | -148 | — |
| Comparative example 2 | 24 | — | -149 | — |
| Comparative example 3 | 24 | 16 | -131 | -91 |

Practical examples 1-3 had characteristics comparable to that of a general ceramic sintered body, even with respect to initial characteristics and post-durability-test results. For example, there was provided within ranges of a residual dielectric polarization Pr: 20-25 $\mu C/cm^2$ and a piezoelectric constant d31: –130--160 pm/V.

On the other hand, for Comparative examples 1 and 2, sufficient values were obtained for initial characteristics thereof, but an electrode leakage was caused after $10^{10}$ times, that is, during a durability test in which an application voltage was repeatedly applied $10^{10}$ times, in other words, a degradation test, whereby an evaluation could not be conducted in the course thereof. For Comparative example 3, it was confirmed that both a residual dielectric polarization and a piezoelectric constant were degraded.

From such a comparison of characteristics of Practical examples 1-3 and Comparative examples 1-3, it could be found that it was preferable for a value of 2×Pr in a P-E hysteresis at 150 kV/cm to be 35 $\mu C/cm^2$ or greater, in regard to an electrical characteristic of an electromechanical conversion film 10.

Liquid drop ejection heads 30 as illustrated in FIG. 3 were fabricated by using the electromechanical conversion elements 10 fabricated in Practical examples 1-3 to conduct an evaluation of liquid ejection therefrom. As a state of ejection was observed in a case where an ink with a viscosity adjusted at 5 cp was used and an application voltage with a simple Push wave form at –10--30 V was applied, it was confirmed that ejection from any nozzle opening was all conducted.

Figure 9A:
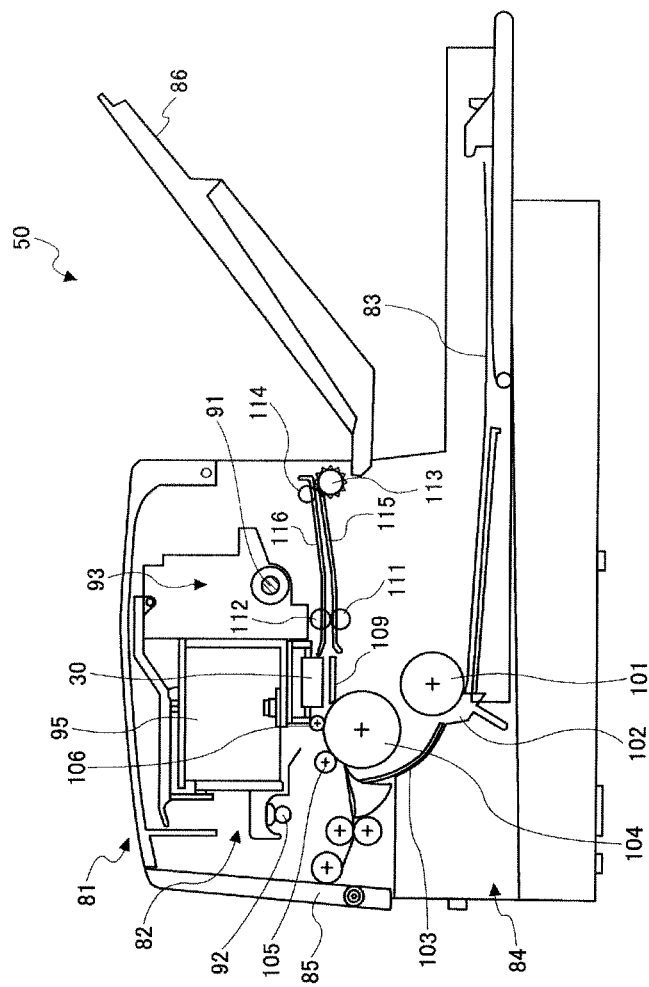
FIGS. 9A and 9B are schematic diagrams of an image forming apparatus with a liquid drop ejection head as illustrated in FIG. 3.
Figure 9B:
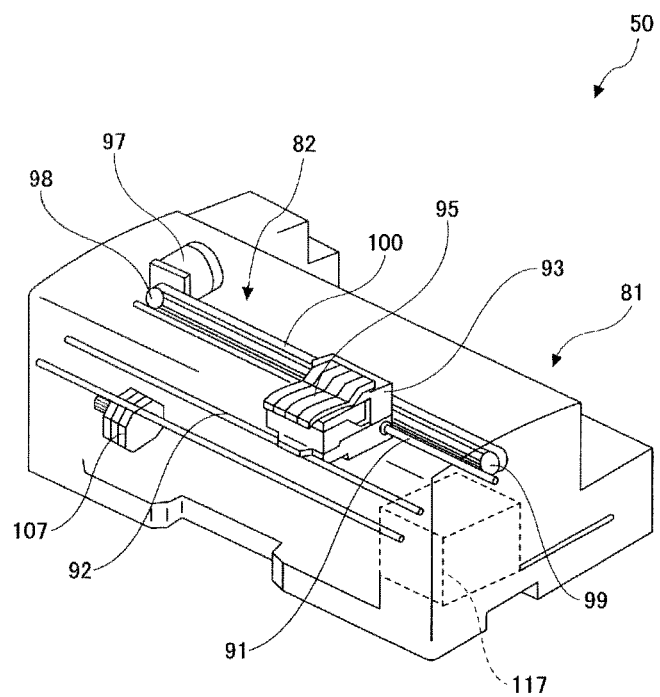

One example of an ink-jet recording apparatus which is an image forming apparatus equipped with liquid drop ejection heads 30 as ink-jet-type recording heads will be described with reference to FIGS. 9A and 9B. Additionally, FIG. 9A is a side view of a mechanical part of the same recording apparatus and FIG. 9B is a perspective view of the same recording apparatus.

An ink-jet recording apparatus 50 as an image forming apparatus is a printer as an ink-jet printer and a digital printing apparatus capable of conducting full-color image formation. The ink-jet recording apparatus 50 conducts an image formation process based on an image signal corresponding to image information received from an exterior.

The ink-jet recording apparatus 50 is capable of conducting image formation on a plain paper sheet which is commonly used for a copy, etc., as well as any sheet-type recording medium such as an OHP sheet, a cardboard such as a card or a postcard, and an envelope. The ink-jet recording apparatus 50 is a single-sided image forming apparatus capable of forming an image on one side of a transfer paper sheet S which is a recording body as a paper sheet being a recording medium and may be a double-sided image forming apparatus capable of forming an image on both sides of a transfer paper sheet S.

The ink-jet recording apparatus 50 contains a printing mechanical part 82 as a liquid drop ejection device having a carriage 93 capable of moving in a main-scanning direction, liquid drop ejection heads 30 which are recording heads as ink-jet heads mounted on the carriage 93, and an ink cartridge 95 as a liquid supply part for supplying inks to the liquid drop ejection heads 30, etc., inside a recording apparatus body 81.

The ink-jet recording apparatus 50 is provided in such a manner that a paper feed cassette 84 capable of stacking a number of paper sheets 83 is detachably attached to a lower part of a body 81 from a front side thereof. Furthermore, the body 81 is capable of opening and inclining a manual tray 85 for manually feeding a paper sheet 83. The paper feed cassette 84 may be a paper feed tray.

The ink-jet recording apparatus 50 incorporates a paper sheet 83 sent and fed from the paper feed cassette 84 or the manual tray 85, records a required image in the printing mechanical part 82, and subsequently ejects a paper sheet onto a ejected paper tray 86 attached to a back face side thereof.

The printing mechanical part 82 slidably holds the carriage 93 in the main-scanning direction by a main guide rod 91 and an auxiliary guide rod 92 which are guide members that transversely hang on left and right side plates which are not illustrated in the figures. The carriage 93 is equipped with the liquid drop ejection heads 30 for ejecting inks of respective colors of yellow (Y), cyan (C), magenta (M), and black (Bk) on the condition that plural nozzles 32 are arranged in a direction intersecting with the main-scanning direction and a direction of ink drop ejection is directed downward. Furthermore, the carriage 92 is equipped with a replaceable ink cartridge 95 for supplying an ink of each color to each of the liquid drop ejection heads 30.

The ink cartridge 95 has an upper atmosphere port which communicates with atmosphere and is not illustrated in the figures and lower supply ports which supply inks to the liquid drop ejection heads 30 and are not illustrated in the figures, and includes porous bodies inside thereof which are filled with inks and are not illustrated in the figures, wherein inks to be supplied to the liquid drop ejection heads 30 are maintained at a slight negative pressure due to a capillary force of the porous bodies. The plural liquid drop ejection heads 30 with the present configuration are included to correspond to respective colors while one liquid drop ejection head 30 may be included to have a configuration for ejecting inks of respective colors.

The carriage 93 is penetrated by and slidably attached to the main guide rod 91 at a downstream side in a paper sheet conveyance direction corresponding to a back side and slidably mounted on the auxiliary guide rod 92 at an upstream side in the paper sheet conveyance direction corresponding to a front side. In order to move the carriage 93 in the main-scanning direction for scanning, a timing belt 100 on which the carriage is fixed extends between and attached to a driving pulley 98 which is driven to rotate by a main scanning motor 97 and a driven pulley 99, so that the carriage 93 is driven forward and backward by forward and backward rotations of the main scanning motor 97.

In order to convey a paper sheet 83 set on the paper feed cassette 84 to a downside of the liquid drop ejection heads 30, the ink-jet recording apparatus 50 is provided with a paper feed roller 101 and friction pad 102 for separately feeding and sending a paper sheet 83 from the paper feed cassette 84, a guide member 103 for guiding the paper sheet 83, a conveyance roller 104 for reversing and conveying a fed paper sheet 83, a conveyance control roller 105 pressed onto a peripheral surface of the conveyance roller 104 and a tip control roller 106 for regulating a delivery angle of a paper sheet 83 from the conveyance roller 104. The conveyance roller 104 is driven to rotate by a sub-scanning motor 107 via a series of gears which are not illustrated in the figures.

A print receiving part 109 which is a paper sheet guide member for guiding a paper sheet 83 delivered from the conveyance roller 104 under the liquid drop ejection heads 30 so as to correspond to a range of movement of the carriage 93 in the main scanning direction is provided under the liquid drop ejection heads 30. At a downstream side of the print receiving part 109 in the paper sheet conveyance direction, a conveyance control roller 111 and spur 112 which are driven to rotate so as to deliver a paper sheet 83 toward a paper ejection direction is provided, and further, a paper ejection roller 113 and spur 114 which deliver the paper sheet 83 to the paper ejection tray 86 and guide members 115 and 116 for providing a paper ejection route are arranged and provided.

At time of recording, while the carriage 93 is moved, the liquid drop ejection heads 30 are driven in response to an image signal, so that inks are ejected onto a stopping paper sheet 83 to record one line and recording of a next line is conducted after the paper sheet 83 is conveyed by a predetermined amount. When a recording end signal or a signal for arrival of a back end of a paper sheet 83 at a recording area is received, a recording operation is ended and the paper sheet 83 is ejected.

A recovery device 117 for conducting recovery of the liquid drop ejection heads 30 against ejection failure is arranged at a position deviating from a recording area at a right edge side of the carriage 93 in a direction of movement thereof. The recovery device 117 includes a capping part, a suction part, and a cleaning part, whose illustration is omitted. The carriage 93 is moved to a side of the recovery device 117 during ready to conduct printing, and the liquid drop ejection heads 30 are capped by a capping part so that a part of ejection port is maintained at a wet state, thereby preventing ejection failure caused by ink drying. Furthermore, an ink which is not associated with recording is ejected in the course of recording, etc., whereby viscosities of inks at all ejection ports are made constant so as to maintain a stable ejection performance.

In a case where ejection failure is caused, etc., while the nozzles 32 of the liquid drop ejection heads 30 are sealed with a capping part, an air bubble, etc., as well as an ink are suctioned by a suction part from the nozzles 32 through a tube which is not illustrated in the figures and an ink or a dust, etc., adhering to a surface of a nozzle plate 33 is removed by a cleaning part, so that recovery is conducted against ejection failure. Furthermore, a suctioned ink is ejected onto a waste ink receiver which is installed at a bottom of the body 81 and is not illustrated in the figures, and absorbed and held in an ink absorber inside the waste ink receiver.

In the ink-jet recording apparatus 50 with such a configuration, the liquid drop ejection heads 30 are mounted and the liquid drop ejection heads 30 include electromechanical conversion elements 10 in such a manner that the electromechanical conversion elements 10 satisfy the condition that a SRO is selected for a material of a base electrode being the lower electrode 21 and a material of the upper electrode 22 and a PZT film is fabricated, whereby proper diffusion of Sr is provided, etc, so that it may be possible to obtain a stable ink ejection characteristic over time, prevent or suppress a failure of ink drop ejection, or obtain a good image quality.

Although a preferred embodiment of the present invention has been described above, an embodiment of the invention is not limited to such a particular embodiment and it is possible to provide a variety of alteration or modification in the spirit and scope of an embodiment of the present invention as may be recited in what is claimed unless a particular limitation is provided in the above description(s).

For example, among, a substrate, a base film, a bonding film, a first electrode, a second electrode, an electromechanical conversion film, a third electrode, and a fourth electrode, an electromechanical conversion element may include at least a first electrode, a second electrode, an electromechanical conversion film, a third electrode, and a fourth electrode, and in addition thereto, may include a bonding layer and/or a base film and/or a substrate.

An image forming apparatus to which an embodiment of the present invention is applied is not limited to a type of an image forming apparatus as described above and may be another type of an image forming apparatus, that is, a single copying or facsimile machine, a complex machine thereof, or a complex machine of monochromatic machines relating thereto, etc., as well as an image forming apparatus used for forming an electrical circuit, or an image forming apparatus used for forming an predetermined image in the field of biotechnology.

A scope of application of an electromechanical conversion element is not limited to an image forming apparatus, and even in a case of being applied to an image forming apparatus, may be included as an actuator on a part different from a liquid drop ejection head in an image forming apparatus. It may be possible to apply an electromechanical conversion element to a three-dimensional formative technique utilizing an ink-jet technique, etc.

For an effect described for an embodiment of the present invention, the most preferable effect produced from an embodiment of the present invention is merely described, and an effect of an embodiment of the present invention is not limited to as described for an embodiment of the present invention.

[Appendix]

<An Illustrative Embodiment(s) of an Electromechanical Conversion Element, a Liquid Drop Ejection Head, a Liquid Drop Election Device, and an Image Forming Apparatus>

At least one illustrative embodiment of the present invention may relate to at least one of an electromechanical conversion element to be used as a driving source, etc., of a liquid drop ejection head for ejecting a liquid drop of an ink, etc., included in an image forming apparatus, etc., such as an ink-jet-type printer, a facsimile machine, or a copying machine, such a liquid drop ejection head with the same, a liquid drop ejection device included in such an image forming apparatus, etc., with the same, and such an image forming apparatus with the same.

At least one illustrative embodiment of the present invention may aim at providing an electromechanical conversion element included in an image forming apparatus, etc., such as an ink-jet-type printer, a facsimile machine, or a copying machine, and being capable of obtaining a temporally stable drive power by using strontium ruthenium oxide for both an upper electrode and a lower electrode, a liquid drop ejection head including the same and ejecting a liquid drop such as an ink, a liquid drop ejection device including the same, and such an image forming apparatus including the same.

At least one illustrative embodiment of the present invention may provide an electromechanical conversion element including a first electrode formed on a substrate or an underlying film directly or indirectly, a second electrode formed on such a first electrode, an electromechanical conversion film formed on such a second electrode, a third electrode formed on such an electromechanical conversion film, and a fourth electrode formed on such a third electrode, wherein the third electrode and the fourth electrode are separate electrodes, wherein the first electrode and the fourth electrode are composed of a Pt-group metal(s), wherein the second electrode and the third electrode are composed of a strontium ruthenium oxide(s), wherein the electromechanical conversion film is composed of a PZT, and wherein Sr-pzt/Sr-sr≤0.01 when a distribution of strontium in a direction from the fourth electrode toward the first electrode is represented by using an intensity ratio of a secondary ion using a SIMS, wherein an intensity for a secondary ion of strontium of the PZT at a position of ½ of a thickness of the electromechanical conversion film in the direction is Sr-pzt and an intensity for a secondary ion of strontium of the strontium ruthenium oxide at a position of ½ of a thickness of the second electrode in the direction is Sr-sr, in order to achieve an object as described above.

Illustrative embodiment (1) is an electromechanical conversion element including a first electrode formed on a substrate or an underlying film directly or indirectly, a second electrode formed on such a first electrode, an electromechanical conversion film formed on such a second electrode, a third electrode formed on such an electromechanical conversion film, and a fourth electrode formed on such a third electrode, wherein the third electrode and the fourth electrode are separate electrodes, wherein the first electrode and the fourth electrode are composed of a Pt-group metal(s), wherein the second electrode and the third electrode are composed of a strontium ruthenium oxide(s), wherein the electromechanical conversion film is composed of a PZT, and wherein Sr-pzt/Sr-sr≤0.01 when a distribution of strontium in a direction from the fourth electrode toward the first electrode is represented by using an intensity ratio of a secondary ion using a SIMS, wherein an intensity for a secondary ion of strontium of the PZT at a position of ½ of a thickness of the electromechanical conversion film in the direction is Sr-pzt and an intensity for a secondary ion of strontium of the strontium ruthenium oxide at a position of ½ of a thickness of the second electrode in the direction is Sr-sr.

Illustrative embodiment (2) is the electromechanical conversion element as described in Illustrative embodiment (1), wherein the electromechanical conversion element is characterized in that a surface roughness of the third electrode is 3 nm or less.

Illustrative embodiment (3) is the electromechanical conversion element as described in Illustrative embodiment (1) or (2), wherein the electromechanical conversion element is characterized in that preferentially orienting crystallographic axes of the second electrode and the third electrode are different.

Illustrative embodiment (4) is the electromechanical conversion element as described in any one of Illustrative embodiments (1) to (3), wherein the electromechanical conversion element is characterized in that the third electrode has a preferentially orienting (110) having a perovskite structure.

Illustrative embodiment (5) is the electromechanical conversion element as described in any one of Illustrative embodiments (1) to (4), wherein the electromechanical conversion element is characterized in that the second electrode has a preferentially orienting (111) having a perovskite structure.

Illustrative embodiment (6) is the electromechanical conversion element as described in any one of Illustrative embodiments (1) to (5), wherein the electromechanical conversion element is characterized in that a thickness of the third electrode is 40 nm or greater and 80 nm or less.

Illustrative embodiment (7) is the electromechanical conversion element as described in any one of Illustrative embodiments (1) to (6), wherein the electromechanical conversion element is characterized in that a composition ratio(s) Sr/Ru of Sr and Ru in the second electrode and the third electrode is/are 0.82 or greater and 1.22 or less.

Illustrative embodiment (8) is the electromechanical conversion element as described in any one of Illustrative embodiments (1) to (7), wherein the electromechanical conversion element is characterized in that an electrical characteristic of the electromechanical conversion film is provided in such a manner that a value of 2Pr at 150 kV/cm in a P-E hysteresis thereof is 35 µC/cm$^2$ or greater.

Illustrative embodiment (9) is the electromechanical conversion element as described in any one of Illustrative embodiments (1) to (8), wherein the electromechanical conversion element is characterized in that the electromechanical conversion film has a preferentially orienting (111).

Illustrative embodiment (10) is a liquid drop ejection head including the electromechanical conversion element as described in any one of Illustrative embodiments (1) to (9) and ejecting a liquid drop by driving such an electromechanical conversion element.

Illustrative embodiment (11) is a liquid drop ejection device including the liquid drop ejection head as described in Illustrative embodiment (10) and a liquid supply part for supplying a liquid for providing a liquid drop to such a liquid drop ejection head.

Illustrative embodiment (12) is an image forming apparatus including the electromechanical conversion element as described in any one of Illustrative embodiments (1) to (9), or the liquid drop ejection head as described in Illustrative embodiment (10), or the liquid drop ejection device as described in Illustrative embodiment (11).

It may be possible to provide an electromechanical conversion element capable of obtaining a temporally stable drive power by using strontium ruthenium oxide for both an upper electrode and a lower electrode, because at least one illustrative embodiment of the present invention may be an electromechanical conversion element including a first electrode formed on a substrate or an underlying film directly or indirectly, a second electrode formed on such a first electrode, an electromechanical conversion film formed on such a second electrode, a third electrode formed on such an electromechanical conversion film, and a fourth electrode formed on such a third electrode, wherein the third electrode and the fourth electrode are separate electrodes, wherein the first electrode and the fourth electrode are composed of a Pt-group metal(s), wherein the second electrode and the third electrode are composed of a strontium ruthenium oxide(s), wherein the electromechanical conversion film is composed of a PZT, and wherein Sr-pzt/Sr-sr≤0.01 when a distribution of strontium in a direction from the fourth electrode toward the first electrode is represented by using an intensity ratio of a secondary ion using a SIMS, wherein an intensity for a secondary ion of strontium of the PZT at a position of ½ of a thickness of the electromechanical conversion film in the direction is Sr-pzt and an intensity for a secondary ion of strontium of the strontium ruthenium oxide at a position of ½ of a thickness of the second electrode in the direction is Sr-sr.

Although the illustrative embodiment(s) and specific example(s) of the present invention have been described with reference to the accompanying drawings, the present invention is not limited to any of the illustrative embodiment(s) and specific example(s) and the illustrative embodiment(s) and specific example(s) may be altered, modified, or combined without departing from the scope of the present invention.

The present application claims the benefit of priority based on Japanese Patent Application No. 2011-203533 filed on Sep. 16, 2011, the entire content of which is hereby incorporated by reference herein.

What is claimed is:

1. An electromechanical conversion element, comprising:
   an electromechanical conversion film including a PZT;
   an upper electrode formed on a top of the electromechanical conversion film and including a first strontium ruthenium oxide; and
   a lower electrode formed on a bottom of the electromechanical conversion film and including a second strontium ruthenium oxide,
   wherein Sr-pzt/Sr-sr≤0.01,
   wherein Sr-pzt is a secondary ion mass spectrometry intensity for a secondary ion of strontium of the PZT at a position of ½ of a thickness of the electromechanical conversion film and Sr-sr is a secondary ion mass spectrometry intensity for a secondary ion of strontium of the second strontium ruthenium oxide at a position of ½ of a thickness of the lower electrode.

2. The electromechanical conversion element as claimed in claim 1, wherein a surface roughness of the upper electrode is 3 nm or less.

3. The electromechanical conversion element as claimed in claim 1, wherein a preferentially orienting crystallographic axis of the upper electrode is different from a preferentially orienting crystallographic axis of the lower electrode.

4. The electromechanical conversion element as claimed in claim 1, wherein a preferentially orienting crystallographic plane of the upper electrode is a (110) plane of a perovskite structure.

5. The electromechanical conversion element as claimed in claim 1, wherein a preferentially orienting crystallographic plane of the lower electrode is a (111) plane of a perovskite structure.

6. The electromechanical conversion element as claimed in claim 1, wherein a thickness of the upper electrode 40 nm or greater and 80 nm or less.

7. The electromechanical conversion element as claimed in claim 1, wherein a ratio of Sr to Ru in each of the upper electrode and the lower electrode is 0.82 or greater and 1.22 or less.

8. The electromechanical conversion element as claimed in claim 1, wherein a value of 2×residual dielectric polarization at 150 kV/cm in a P-E hysteresis of the electromechanical conversion film is 35 µC/cm² or greater.

9. The electromechanical conversion element as claimed in claim 1, wherein a preferentially orienting crystallographic plane of the electromechanical conversion film is a (111) plane.

10. A liquid drop ejection head, comprising the electromechanical conversion element as claimed in claim 1 and a driving part configured to drive the electromechanical conversion element to eject a liquid drop.

11. A liquid drop ejection device, comprising the liquid drop ejection head as claimed in claim 10 and a liquid supply part configured to supply a liquid for a liquid drop to the liquid drop ejection head.

12. An image forming apparatus, comprising the liquid drop ejection device as claimed in claim 11.

* * * * *